(12) United States Patent
Joo et al.

(10) Patent No.: US 9,034,141 B2
(45) Date of Patent: May 19, 2015

(54) THIN FILM FORMING APPARATUS AND THIN FILM FORMING METHOD USING THE SAME

(71) Applicant: Samsung Display Co., Ltd., Yongin, Gyeonggi-Do (KR)

(72) Inventors: Sung-Joong Joo, Yongin (KR); You-Min Cha, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 36 days.

(21) Appl. No.: 13/906,138

(22) Filed: May 30, 2013

(65) Prior Publication Data

US 2014/0131311 A1     May 15, 2014

(30) Foreign Application Priority Data

Nov. 13, 2012  (KR) ........................ 10-2012-0128373

(51) Int. Cl.
*H01J 37/32*      (2006.01)
(52) U.S. Cl.
CPC ....... *H01J 37/32366* (2013.01); *H01J 37/3244* (2013.01)
(58) Field of Classification Search
None
See application file for complete search history.

(56) References Cited

U.S. PATENT DOCUMENTS

| | | | | |
|---|---|---|---|---|
| 3,756,511 | A | * | 9/1973 | Shinroku et al. ........... 239/132.3 |
| 3,830,686 | A | * | 8/1974 | Lehrer ............................... 430/5 |
| 4,121,083 | A | * | 10/1978 | Smyth ........................ 219/76.16 |
| RE31,018 | E | * | 8/1982 | Harrington et al. ...... 219/121.47 |
| 5,486,383 | A | * | 1/1996 | Nowotarski et al. .......... 427/446 |
| 5,556,558 | A | * | 9/1996 | Ross et al. .................. 219/121.5 |
| 5,738,281 | A | * | 4/1998 | Zurecki et al. ................. 239/290 |
| 6,001,426 | A | * | 12/1999 | Witherspoon et al. ........ 427/449 |
| 6,054,669 | A | * | 4/2000 | Warren, Jr. ............... 219/121.39 |
| 6,236,013 | B1 | * | 5/2001 | Delzenne ................. 219/121.54 |
| 6,737,812 | B2 | | 5/2004 | Yuasa et al. |
| 6,800,336 | B1 | * | 10/2004 | Fornsel et al. ................. 427/562 |
| 7,771,798 | B1 | * | 8/2010 | Grosse et al. ................. 427/569 |
| 8,696,921 | B2 | * | 4/2014 | Park et al. ........................ 216/67 |
| 2005/0118794 | A1 | * | 6/2005 | Babayan et al. .............. 438/584 |
| 2005/0271951 | A1 | | 12/2005 | Kim |
| 2008/0023525 | A1 | * | 1/2008 | Maeda et al. .................... 228/18 |
| 2008/0099441 | A1 | * | 5/2008 | Carr ................................. 216/67 |
| 2012/0269968 | A1 | * | 10/2012 | Rayner, Jr. ............... 427/255.26 |
| 2013/0160858 | A1 | * | 6/2013 | Francis ............................. 137/1 |
| 2014/0033971 | A1 | * | 2/2014 | Kramer et al. ................ 118/301 |

FOREIGN PATENT DOCUMENTS

| | | |
|---|---|---|
| JP | 2003-100717 A | 4/2003 |
| JP | 2010-185121 A | 8/2010 |
| KR | 10-2005-0115105 A | 12/2005 |

\* cited by examiner

*Primary Examiner* — Allan Olsen
(74) *Attorney, Agent, or Firm* — Knobbe, Martens, Olson & Bear, LLP

(57) ABSTRACT

A thin film forming apparatus and a thin film forming method using the same are disclosed. In one aspect, the thin film forming apparatus comprises a mask that includes a blocking portion and an opening. It also includes an etching source that jets an etching gas through the opening of the mask to etch a thin film according to a pattern. The mask includes a gas blower for blowing a gas around the opening so that the etching gas does not penetrate into a thin film area corresponding to the block portion. When the thin film forming apparatus is used, a normal residual area of a thin film may be safely preserved and patterning may be accurately performed. Thus, the quality of a product manufactured by using the thin film forming apparatus may be improved.

8 Claims, 2 Drawing Sheets

THIN FILM FORMING APPARATUS AND THIN FILM FORMING METHOD USING THE SAME

CROSS-REFERENCE TO RELATED APPLICATIONS

This application claims the benefit of Korean Patent Application No. 10-2012-0128373, filed on Nov. 13, 2012, in the Korean Intellectual Property Office, the disclosure of which is incorporated herein in its entirety by reference.

BACKGROUND

1. Field of the Technology

The described technology generally relates to a thin film forming apparatus for depositing a thin film on a surface of a structure by generating a deposition source vapor, and in particular, to a thin film forming apparatus for forming patterns and a thin film forming method using the thin film forming apparatus.

2. Description of the Related Technology

A thin film formation process, for example, a deposition process in which a deposition source vapor is formed and then is directed onto the surface of a substrate, is often used.

For patterning a thin film, there is a method in which deposition and patterning is performed at the same time by using a pattern mask during the deposition. In addition, there is a method in which deposition is performed on a surface of a structure to form a thin film and thereafter an unnecessary portion is etched by using plasma etching. The method in which a thin film is patterned by using the plasma etching is preferred due to the simplified deposition process.

When patterning a thin film by the plasma etching, a portion that should not be removed may be etched by a plasma gas and thus an accurate pattern may not be formed. That is, not only an area that should be removed by the plasma gas, but a normal residual area that should be preserved may be also etched. In this case, the quality of a thin film manufactured by using the plasma etching may be degraded, and thus solutions to this problem are needed.

SUMMARY OF CERTAIN INVENTIVE ASPECTS

In some inventive aspects, a thin film forming apparatus and method do not damage a normal residual area caused by plasma etching.

Another aspect is a thin film forming apparatus including: a mask that includes a blocking portion and opening configured to form a predetermined pattern and is disposed on a substrate on which a thin film is formed; and an etching source that jets an etching gas through the opening of the mask to etch the thin film according to the predetermined pattern, wherein the mask includes a gas blower configured to blow a gas around the opening so that the etching gas does not penetrate into a thin film area corresponding to the block portion.

The mask may further include a shutter configured to adjust the size of the opening.

The etching gas may be a plasma gas.

A jetting portion of the etching source, from which the etching gas is jetted, may be fixedly disposed to correspond to the opening of the mask.

The etching source may jet the etching gas on the whole surface of the substrate.

The etching source may jet the etching gas while the etching source reciprocates above the mask.

The etching source may include a jetting portion configured to jet the etching gas, an air curtain portion configured to form an air curtain around the jetting portion, and an exhausting portion configured to exhaust a surrounding air to the outside.

According to another aspect of the present invention, there is provided a thin film forming method including: disposing a mask, which includes a blocking portion and an opening configured to form a predetermined pattern, on a substrate on which a thin film is formed; etching the thin film according to the predetermined pattern by jetting an etching gas through the opening of the mask; and blowing a gas around the opening so that the etching gas does not penetrate into a thin film area corresponding to the block portion by operating a gas blower included in the mask.

The thin film forming method may further include adjusting the size of the opening by using a shutter included in the mask.

The etching gas may be a plasma gas.

An etching source may jet the etching gas to the opening of the mask.

An etching source may jet the etching gas on the whole surface of the substrate.

An etching source may jet the etching gas while the etching source reciprocates above the mask.

An etching source that jets the etching gas may include a jetting portion configured to jet the etching gas, an air curtain portion configured to form an air curtain around the jetting portion, and an exhausting portion configured to exhaust a surrounding air to the outside.

According to a thin film forming apparatus and a thin film forming method according to embodiments of the present invention, patterning of a thin film may be accurately and stably performed. Thus, the quality of a product manufactured by using the thin film forming apparatus and the thin film forming method may be improved.

DETAILED DESCRIPTION OF CERTAIN INVENTIVE EMBODIMENTS

Hereinafter, embodiments of the present invention are described in detail below with reference to the attached drawings.

Figure 1:
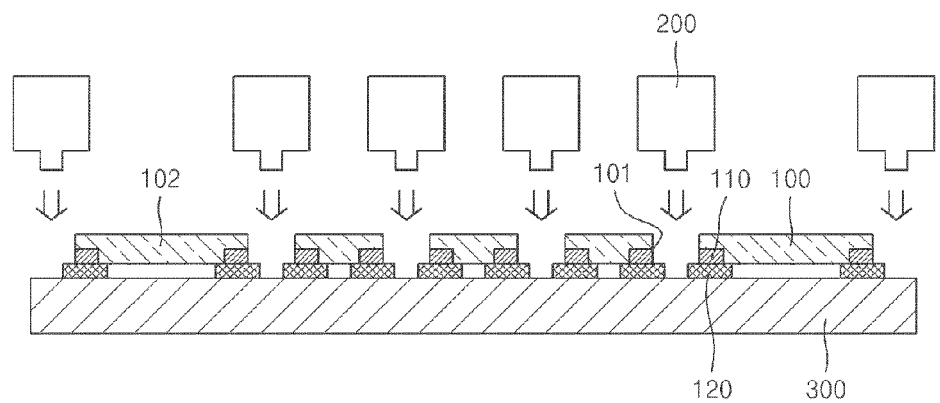
FIG. 1 is a view of a thin film forming apparatus according to an embodiment.
Figure 4:
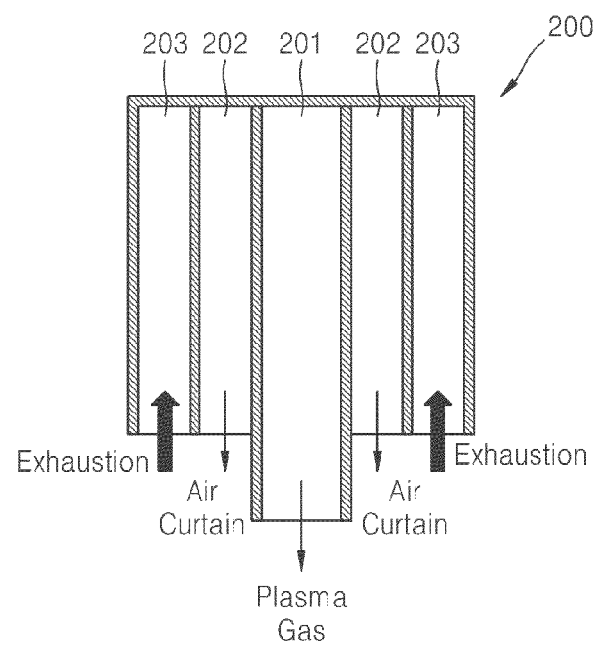
FIG. 4 is a view showing an internal structure of an etching source included in a thin film forming apparatus according to one of the embodiments.

First, a thin film forming apparatus according to an embodiment is described below with reference to FIGS. 1 and 4. FIG. 1 is a view of a thin film forming apparatus according to an embodiment, and FIG. 4 is a view showing an internal structure of an etching source included in the thin film forming apparatus.

As illustrated in FIG. 1, the thin film forming apparatus according to an embodiment includes a mask 100 that is disposed on a substrate 300 on which a thin film (not shown) has been formed, and an etching source 200 that selectively etches the thin film on the substrate 300 through the mask 100 to partially remove the thin film.

The mask 100 includes an opening 101 for opening a passage to the substrate 300 and a blocking portion 102 for blocking a passage to the substrate 300, and the etching source 200 is fixedly disposed at each location corresponding to the opening 101. Accordingly, when the etching source 200 operates, an etching gas enters through the opening 101 and thus a portion of the thin film, which is located at a position corresponding to the opening 101 on the substrate 300, is removed. The thin film may be a thin film that is formed on the substrate 300 through deposition, such as an organic film of an organic light-emitting display device, and the etching gas may be a plasma gas.

In some embodiments, the mask 100 may include a shutter 120 for adjusting the size of the opening 101 and a gas blower 110 for blowing a gas to prevent the etching gas from flowing into the blocking portion 102.

The gas blower 110 blows a gas so that the etching gas generated by the etching source 200 does not damage a portion of the thin film under the blocking portion 102, and thus, the etching gas does not penetrate into the blocking portion 102. That is, when the gas blower 110 of the mask 100 blows a gas, the etching gas is restricted to be only within the opening 101 by the gas of the gas blower 110, and thus, the portion of the thin film under the blocking portion 102, that is, a normal residual area of the thin film, is not damaged and is safely preserved. A noble gas such as argon (Ar) may be used as a gas by the gas blower 110.

In some embodiments, the etching source 200 may have a structure illustrated in FIG. 4. That is, the etching source 200 may have a structure including a jetting portion 201 from which an etching gas is jetted, an air curtain portion 202 for forming an air curtain by jetting a gas around the jetting portion 201, and an exhausting portion 203 for exhausting a surrounding air to the outside. Accordingly, while the etching gas is jetted through the jetting portion 201, the air curtain portion 202 prevents the etching gas from leaking out of a jet area and particles that are dispersed during an etching process are exhausted to the outside through the exhausting portion 203. In this case, since the gas blower 110 in the mask 100 restricts the etching gas to be within the opening 101 and the etching source 200 also limits a working range of the etching gas by using the air curtain portion 202, the risk of damaging the normal residual area of the thin film is further reduced.

The shutter 120 adjusts the size of the opening 101, and thus, may be moved to adjust the size of the opening 101 when a standard of a pattern to be etched is changed little by little. In some embodiments, the shutter 120 may use a general slide opening and closing structure.

The thin film forming apparatus having the configuration described above may be operated as follows.

First, the substrate 300, on which a thin film has been formed through a deposition process, is prepared, and the mask 100 is disposed on the substrate 300 as shown in FIG. 1.

Next, an area of the opening 101 to be etched according to a standard of a desired pattern is defined by moving the shutter 120.

Next, an etching gas is jetted by operating the etching source 200 and etching is started. In this case, the gas blower 110 is operated together with the etching source 200 so that the etching gas does not penetrate into a normal residual area of the thin film under the blocking portion 102. Since while the jetting portion 201 of the etching source 200 is operated, the air curtain portion 202 is also operated together with the jetting portion 201, a result that the etching gas goes out of a determined etching area and thus damages a normal residual area of the thin film hardly occurs.

Accordingly, since by using the thin film forming apparatus, the normal residual area of the thin film may be safely preserved and patterning may be accurately performed, the defect rate of a product manufactured by using the thin film forming apparatus may be greatly reduced.

Figure 2:
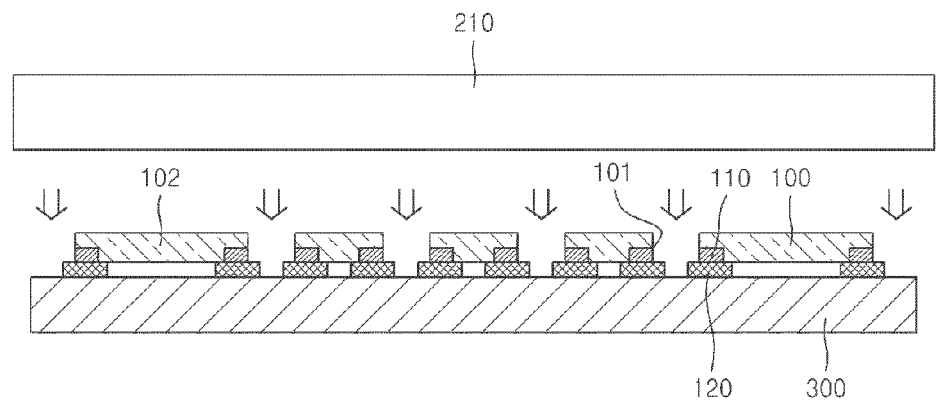
FIG. 2 is a view of a thin film forming apparatus according to another embodiment.

Although in the embodiment of FIG. 1, the etching source 200 is fixedly disposed to correspond to the opening 101 of the mask 100, an etching source 210 may be configured to jet an etching gas on the whole surface of the substrate 300, as illustrated in FIG. 2. Also in this case, etching is performed only in the area of the opening 101 leading to the substrate 300, and thus, the patterning of the thin film may be performed substantially identical to what is shown in FIG. 1.

Figure 3:
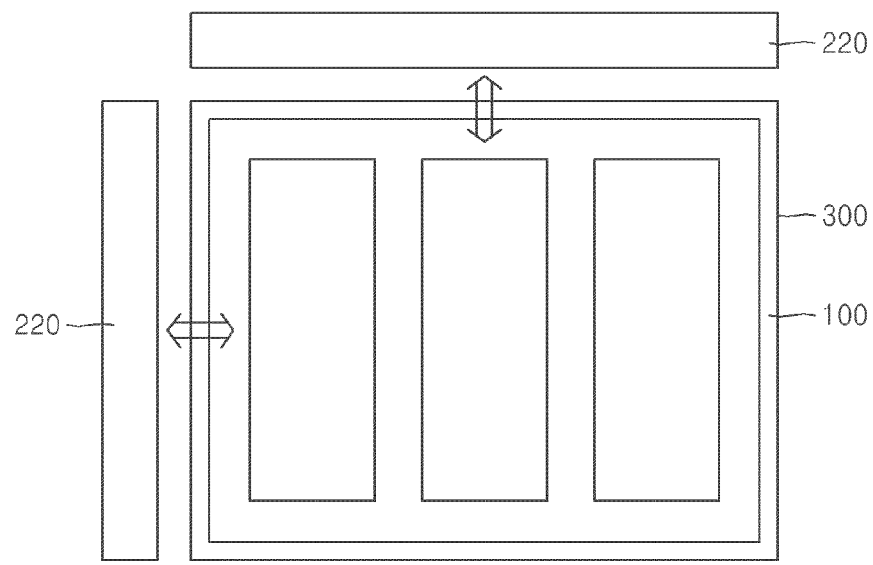
FIG. 3 is a view of a thin film forming apparatus according to another embodiment.

Not only the fixed type etching source 200 or 210 may be adopted as in the embodiments described above, but also a scan type reciprocating etching source 220 may be adopted as in FIG. 3. That is, as in FIG. 3, two etching sources 220 reciprocating in directions orthogonal to each other may be installed and may jet an etching gas while scanning a surface of the substrate 300. Also in this case, etching is performed only in the area of the opening 101 leading to the substrate 300, and thus, the patterning of the thin film may be performed substantially identical to what is shown in FIG. 1.

Consequently, when a thin film forming apparatus as described above is used, a normal residual area of a thin film may be safely preserved and patterning may be accurately performed. Thus, the quality of a product manufactured by using the thin film forming apparatus may be stabilized, and productivity may be improved.

The above embodiments are presented for illustrative purposes only, and are not intended to define meanings or limit the scope of the present invention as set forth in the following claims. Those skilled in the art will understand that various modifications and equivalent embodiments of the present invention are possible without departing from the spirit and scope of the present invention defined by the appended claims.

What is claimed is:

1. A thin film forming apparatus comprising:
a mask including a plurality of blocking portions and a plurality of openings alternately formed with respect to the blocking portions, wherein the mask is configured to form a predetermined pattern on a substrate on which a thin film is to be formed; and
an etching source configured to jet an etching gas through the openings of the mask to etch the thin film according to the predetermined pattern, wherein each of the blocking portions of the mask comprises a gas blower configured to blow gas around the openings so that the etching gas does not penetrate into a thin film area corresponding to the blocking portions.

2. The thin film forming apparatus of claim 1, wherein the mask further comprises a plurality of shutters formed adjacent to the openings, and wherein each pair of the shutters are configured to adjust the size of the corresponding opening.

3. The thin film forming apparatus of claim 1, wherein the etching gas is a plasma gas.

4. The thin film forming apparatus of claim 1, wherein the etching source comprises a plurality of jetting portions each configured to jet the etching gas, and wherein the jetting portions are is fixedly formed to correspond to the openings of the mask.

5. The thin film forming apparatus of claim 1, wherein the etching source is configured to jet the etching gas on a majority portion of the substrate.

6. The thin film forming apparatus of claim 1, wherein the etching source is configured to jet the etching gas while the etching source reciprocates above the mask.

7. The thin film forming apparatus of claim 1, wherein the gas blower is located on an edge of each of the blocking portions.

8. A thin film forming apparatus comprising:
- a mask that comprises a blocking portion and an opening configured to form a predetermined pattern and is disposed on a substrate on which a thin film is formed; and
- an etching source that jets an etching gas through the opening of the mask to etch the thin film according to the predetermined pattern, wherein the mask comprises a gas blower configured to blow a gas around the opening so that the etching gas does not penetrate into a thin film area corresponding to the block portion,
- wherein the etching source comprises a jetting portion configured to jet the etching gas, an air curtain portion configured to form an air curtain around the jetting portion, and an exhausting portion configured to exhaust a surrounding air to the outside.

* * * * *